United States Patent
Lang

(10) Patent No.: US 7,555,275 B2
(45) Date of Patent: Jun. 30, 2009

(54) SYSTEMS, METHODS AND DEVICES FOR DUAL CLOSED LOOP MODULATION CONTROLLER FOR NONLINEAR RF AMPLIFIER

(75) Inventor: David R Lang, Phoenix, AZ (US)

(73) Assignee: ViaSat, Inc., Carlsbad, CA (US)

( * ) Notice: Subject to any disclaimer, the term of this patent is extended or adjusted under 35 U.S.C. 154(b) by 537 days.

(21) Appl. No.: 11/279,857

(22) Filed: Apr. 14, 2006

(65) Prior Publication Data
US 2007/0243838 A1 Oct. 18, 2007

(51) Int. Cl.
*H04B 1/06* (2006.01)
(52) U.S. Cl. .............. 455/260; 455/127.2; 455/234.1; 455/340; 375/345
(58) Field of Classification Search .............. 455/114.2, 455/114.3, 126, 127.1, 127.3, 234.1, 240.1, 455/255–260, 338–340, 341; 375/345
See application file for complete search history.

(56) References Cited

U.S. PATENT DOCUMENTS

| | | | | |
|---|---|---|---|---|
| 5,861,766 A | * | 1/1999 | Baumer et al. | 327/105 |
| 6,141,163 A | * | 10/2000 | Nakamura et al. | 360/51 |
| 6,275,057 B1 | * | 8/2001 | Takizawa | 324/765 |
| 2005/0074076 A1 | * | 4/2005 | Chen et al. | 375/317 |
| 2005/0275976 A1 | * | 12/2005 | Taimela et al. | 361/18 |
| 2006/0002157 A1 | * | 1/2006 | Petter et al. | 363/37 |

FOREIGN PATENT DOCUMENTS
WO WO 00/35080 6/2000
WO WO 2005/027342 3/2005

* cited by examiner

*Primary Examiner*—Nhan T Le
(74) *Attorney, Agent, or Firm*—Snell & Wilmer L.L.P.

(57) ABSTRACT

In accordance with various exemplary embodiments of the present invention, systems, methods and devices are configured to facilitate RF envelope amplitude control. For example, a RF envelope amplitude control system comprises: a RF amplifier, wherein the RF amplifier is associated with a feedback device that is configured to create a first feedback signal representing the power in an RF output signal; a transmit waveform generator configured to generate a reference waveform signal; an adaptive table waveform generator configured to compare the reference waveform signal and the first feedback signal and to create a second feedback signal based on that comparison; and a loop filter configured to combine the reference waveform signal, the first feedback signal, and the second feedback signal to form an amplifier control signal, wherein the amplifier control signal is provided to the RF amplifier to adjust the RF output signal to conform to a specified RF envelope.

12 Claims, 8 Drawing Sheets

SYSTEMS, METHODS AND DEVICES FOR DUAL CLOSED LOOP MODULATION CONTROLLER FOR NONLINEAR RF AMPLIFIER

FIELD OF INVENTION

The present invention generally relates to RF amplifiers, and more particularly, to envelope controllers for nonlinear RF amplifiers.

BACKGROUND OF THE INVENTION

In some types of radio frequency ("RF") transmitters, the RF output signal of an RF amplifier is required to closely match one of several predetermined amplitude envelopes. For example, RF transmitters exist where the transmitter output consists of continuous wave ("CW") or phase modulated RF pulses that are required to closely match one of several predetermined amplitude envelopes. One such transmit mode is known as Tactical Air Command And Navigation ("TACAN") involving amplitude modulation. Another is Time Domain Multiple Access ("TDMA") involving phase modulation. Unfortunately, RF transmitters and their components are often subject to relatively severe temperature stresses, which can make it more difficult to match the desired waveform envelope.

In addition, transmitter frequency range, output power, size and efficiency requirements associated with, for example TACAN/TDMA, have dictated the use of highly nonlinear (typically 'class C') devices in the RF power amplifiers. To meet the envelope accuracy requirements of these nonlinear devices, closed loop control has been used to reduce the difference between the actual RF amplifier output waveform and a desired (as set by industry standards) waveform. However, during the interval between transmitted pulses, no RF energy is allowed to be transmitted; therefore a closed loop condition cannot exist during this interval.

A single control loop, operating under this constraint, having sufficient gain and bandwidth to meet the accuracy requirements over some portions of the output envelope, will likely be unstable over other portions of the output envelope. The instability is due primarily to the nonlinearities in the controlled element (the actual RF amplifier chain) and the absence of a valid closed loop condition in the time interval between RF pulses.

The control of transmitted RF pulses by single, analog closed loops is well known (e.g., Philips part #PCF5708, "Power Amplifier Controller for GSM and PCN Systems", the data sheet for an IC controller). However, the waveform rise and fall times for GSM are approximately 30 μsec versus 3.5 μsec for Joint Tactical Radio System ("JTRS") and TACAN and 0.25 μsec for TDMA, therefore the previous solutions do not provide the required control bandwidth.

Existing controllers have also generally been used with RF amplifiers that exhibit an approximately linear control transfer function (e.g., gate voltage control in a GaAs FET module). By contrast, due to the low gain of the devices required for JTRS-compatible applications, many stages are needed to achieve the required gain and output power. To meet efficiency requirements, each stage is normally operated under 'class B' or 'class C' conditions, and the RF input to RF output amplitude transfer function of the cascaded or series connection of multiple stages is therefore highly nonlinear.

Conventionally, the closed loop output distortion (the deviation of the RF output envelope from an ideal shape) is minimized by increasing both the closed loop gain and bandwidth up to the stability limit imposed by hardware delays and phase shifts within the closed loop. By contrast, the maximum allowed spurious, or modulation dependent, RF sideband output levels of a JTRS/TACAN transmitter are relatively low, and can be seriously degraded (increased) by excessive gain in the waveform control loop. In practice, therefore, the selection of the optimum loop gain for a given set of conditions is a compromise between the conflicting requirements of waveform distortion and minimum sideband noise. This optimum point varies with temperature, required power level and operating frequency.

Thus, there exists a need for an RF envelope amplitude controller that is configured to achieve RF output envelope control in applications having high frequencies, and/or nonlinearities, such as TACAN/TDMA applications. There also exists a need for a flexible RF envelope amplitude controller that can readily adjust for temperature, operating power mode, operating frequency, and waveform changes.

SUMMARY OF THE INVENTION

In accordance with various exemplary embodiments of the present invention, a RF envelope amplitude control system comprises: a RF amplifier configured to receive a RF input signal and to output a RF output signal, wherein the RF amplifier is associated with a feedback device that is configured to create a first feedback signal representing the power in the RF output signal; a transmit waveform generator configured to generate a reference waveform signal; an adaptive table waveform generator configured to compare the reference waveform signal and the first feedback signal and to create a second feedback signal based on the difference between the reference waveform signal and the first feedback signal; and a loop filter configured to combine the reference waveform signal, the first feedback signal, and the second feedback signal to form an amplifier control signal, wherein the amplifier control signal is provided to the RF amplifier to adjust the RF output signal with respect to a RF envelope.

In another exemplary embodiment, a transmitter system comprises: an RF amplifier; and an RF envelope amplitude controller; wherein the RF envelope controller is configured to provide an amplifier control signal to the RF amplifier and to receive a first feedback signal from the RF amplifier, wherein the amplifier control signal is partially based on a reference waveform signal; wherein the first feedback signal represents the power of an RF output signal from the RF amplifier, wherein the RF envelope amplitude controller is configured to modify the amplifier control signal by the first feedback signal; wherein the RF envelope amplitude controller is further configured to compare the first feedback signal to the reference waveform signal and to create a second feedback signal based on the comparison; and wherein the RF envelope amplitude controller is configured to further modify the amplifier control signal based on the second feedback signal.

In another exemplary embodiment, a RF envelope amplitude control method comprises the steps of: receiving a reference waveform signal at an RF envelope amplitude controller; receiving a feedback signal, based on the RF output of an RF transmit amplifier, at the RF envelope amplitude controller; comparing the feedback signal to the reference waveform signal; adjusting an adaptive table to store a waveform value at a memory location in the adaptive table; combining the reference waveform signal, the first feedback signal and the second feedback signal to form an amplifier control signal that facilitates adjusting the amplifier RF output signal to achieve a close approximation of a desired waveform envelope.

BRIEF DESCRIPTION OF THE DRAWING FIGURES

A more complete understanding of the present invention may be derived by referring to the detailed description and claims when considered in connection with the drawing Figures, wherein like reference numbers refer to similar elements throughout the drawing Figures, and:

DETAILED DESCRIPTION

Figure 1:
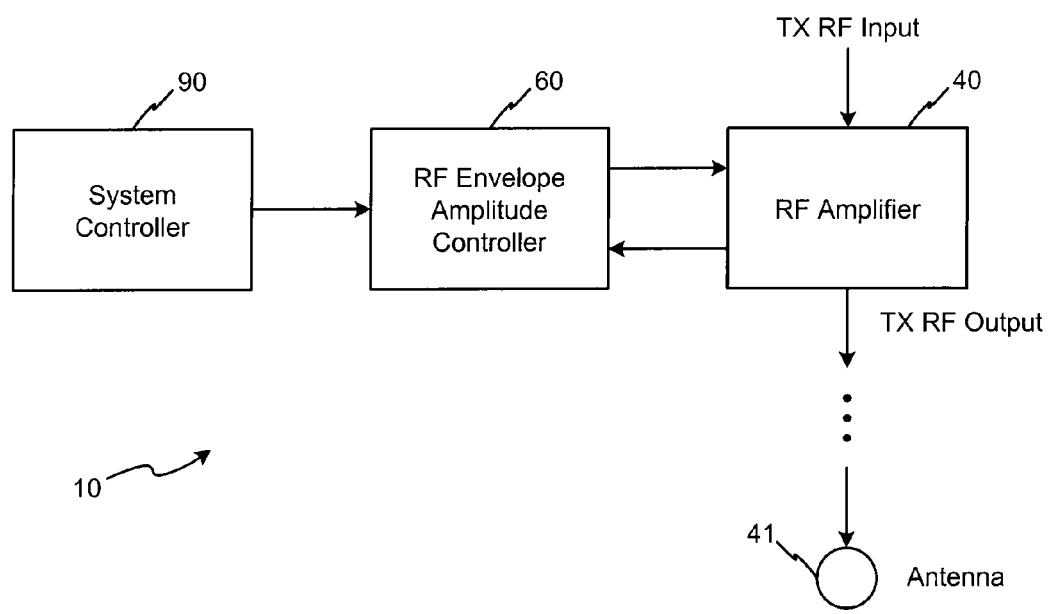
FIG. 1 is a block diagram overview of an exemplary transmitter system.

While the exemplary embodiments herein are described in sufficient detail to enable those skilled in the art to practice the invention, it should be understood that other embodiments may be realized and that logical and mechanical changes may be made without departing from the spirit and scope of the invention. Thus, the following detailed description is presented for purposes of illustration only and not of limitation.

In accordance with various exemplary embodiments of the invention, systems, methods and devices are configured for providing RF envelope amplitude control. The control system is configured to facilitate amplification, in non-linear RF amplifiers, of RF signals prior to transmission. Moreover, the control system is configured to facilitate amplification of RF signals having stringent requirements on the waveform output envelopes.

In accordance with an exemplary embodiment of the present invention, a transmitter system is configured to receive a transmit RF signal, amplify that signal or otherwise process that signal, and output an amplified/processed signal that substantially conforms to specific waveform output envelope requirements. Furthermore, the transmitter system may be used in connection with higher level assemblies. In one exemplary embodiment, the transmitter system is configured for use in airplane avionics, such as in Multipurpose Information Distribution System ("MIDS")—JTRS. Although described herein in terms of a transmitter RF amplification system, the system and method is equally applicable to any non-linear processes. For example, the transmitter system may be configured for use in one or more individual nodes of an RF repeater network, or for use in one or more individual nodes of an optical repeater network.

In accordance with various exemplary embodiments of the present invention, the transmitter system comprises an RF envelope amplitude controller used in a RF transmitter for a specific application. The output of the transmitter consists of RF pulses that are amplitude and/or phase modulated. By way of example, the transmitter RF output voltage pulses are described herein to consist of two different, standard shapes (hereafter termed 'waveforms' or 'envelopes'), commonly designated TACAN and TDMA. However, other waveforms may also be used in various exemplary embodiments of the present invention.

In accordance with various exemplary embodiments of the present invention, a transmitter system is configured to overcome the instability experienced in prior art solutions through the use of two closed control loops. The two closed control loops exploit a performance advantage based on the complete a priori knowledge of the relevant required transmitted pulse amplitude envelopes. A first closed loop contributes a repetitive or stationary component of the solution to the required modulator input. A second loop acts to reduce the non-stationary, or residual, portion of the error between the approximately corrected RF output and the desired waveform. Compared with the gain required in a single loop solution, substantially less gain is required of the second loop, thereby improving stability.

In accordance with one aspect of an exemplary embodiment, the transmitter pulse shaping is realized by amplitude modulation, utilizing two modulation controller functions. The desired shaping or modulation is applied to an externally supplied RF input pulse, which is substantially a rectangular pulse, i.e., the peak sinusoidal carrier voltage is essentially constant during the input pulse. A closed loop controller 'B' is then used to reduce and/or minimize the error between the measured RF amplifier output voltage waveform and a reference waveform. The closed loop bandwidth of the 'B' controller is configured to substantially correct intra-pulse amplitude distortion introduced by nonlinearities in the amplifier stages of the transmitter.

During the interval between transmitted pulses, no RF energy is allowed to be transmitted; therefore the 'B' loop is not closed during this interval. Additionally, according to well known principles, the RF input level to an active device operating in "class C" mode must exceed a minimum threshold or level before useable energy appears at the device output. This threshold is heavily dependent on external factors such as operating frequency and ambient temperature. It is therefore highly desirable that, immediately prior to the start of an RF input pulse, the modulation control point exists in a state that approximately effects the correct 'class C' device RF threshold voltage, despite the absence of meaningful input to the 'B' controller.

In accordance with various exemplary embodiments of the present invention, the transmitter system includes a closed loop controller 'A' comprising a waveform generator and digital memory. The error input signal (feedback signal) is common to both the 'A' and 'B' control loops. The primary purpose of controller 'A' is to generate a correction table (or waveform), synchronized in time with the reference waveform for the 'B' loop.

Unlike the reference waveform, the contents of the correction table can adapt, or change, over multiple pulses, based on the common loop error signal. In one exemplary embodiment, this error is evaluated at every data point (memory location) of the reference waveform table. However, in other embodiments, the error may be evaluated at other intervals, e.g., at every second or third data point. In an exemplary embodiment, if the error magnitude exceeds a fixed threshold, the contents of the correction (adaptive) table are incremented or decremented by a fixed integer value. The resulting adaptive table waveform may be summed with the reference waveform and input to the loop filter.

In accordance with various aspects of an exemplary embodiment, the 'A' loop adaptive table waveform is active (i.e., converges to non zero values) primarily at the beginning and the end of the desired RF pulse, when the gain of the 'B' loop is undefined due to the sudden presence or absence of the loop error signal. The control loop 'A' bandwidth is much lower than that of the 'B' loop, and its output provides an approximately correct value of the modulation control signal input to the transmitter. The closed loop gain requirement for the 'B' loop is thereby reduced.

Transmitter System 10:

In accordance with one aspect of an exemplary embodiment of the present invention, and with reference to FIG. 1, an exemplary transmitter system 10 comprises an RF amplifier 40 and an RF envelope amplitude controller 60. Transmitter system 10 may further comprise a system controller 90.

In accordance with an exemplary embodiment, amplifier 40 is configured to receive an RF input signal, amplify and/or amplitude modulate the RF signal, output a RF output signal, and provide a sample of the RF output signal. In this regard, it explicitly stated that the amplification may be made by any suitable amplifier. In one exemplary embodiment of the present invention, amplifier 40 is a class C amplifier. In various exemplary embodiments, amplifier 40 is a non-linear amplifier. However, it should be noted that although described herein as an RF amplifier, amplifier 40 may be any non-linear device, including optical processing functional blocks, such as fiber optic transmitters or repeaters.

Amplifier 40 is further configured to receive a control signal that controls the RF output power of the amplifier. In addition, amplifier 40 is configured to provide a feedback signal based on the RF output signal.

In accordance with an exemplary embodiment, amplifier 40 is a Part No. 1036159 by US Monolithics. However, amplifier 40 may comprise any suitable non-linear amplifier that is configured to receive an amplifier output power control signal and that is configured to generate a feedback signal.

In accordance with an exemplary embodiment, RF envelope amplitude controller 60 is configured to receive a system controller signal. In one exemplary embodiment, the system controller signal comprises a clock signal and a control signal. Furthermore, the system controller signal may comprise other signals. The signal may be received from, for example, system controller 90. System controller 90 may be a single device or multiple devices configured to provide the signals described herein.

In accordance with various exemplary embodiments, system controller 90 is configured to provide a control signal that includes information related to the desired waveform of the RF output signal of the amplifier. For example, the control signal may be a memory address that is related to a waveform stored therein. In another exemplary embodiment of the present invention, the control signal is a reference waveform signal. In one exemplary embodiment, the reference waveform is a first approximation of the amplifier control signal that will cause amplifier 40 to generate an RF output signal approximating the desired waveform envelope. In yet another exemplary embodiment, the control signal is a code that facilitates "looking up" the reference waveform signal.

In a further exemplary embodiment, the desired waveform (or reference waveform) is represented by an integral number M of predefined amplitude values that are stored digitally. After receiving an external command to begin an RF output power control sequence, M waveform time-samples are then sequentially provided to the RF envelope amplitude controller 60 at a rate determined by a system clock. After the Mth time-sample is communicated to the amplitude controller, the RF output control sequence is terminated, and the amplitude controller is placed in a condition to correctly respond to another external command to begin another RF output power control sequence. In this exemplary embodiment, system controller 90 is configured to provide all of the waveform time-sample counting, arithmetic, and control functions that are minimally required for the correct operation of the RF envelope amplitude controller.

In one example, the control signal may indicate that the desired waveform is such as would be suitable for TACAN, TDMA, Frequency Shift Keying ("FSK"), Gaussian Minimum Shift Keying ("GMSK"), Minimum Shift Keying ("MSK"), Phase Shift Keying ("PSK"), or any other waveform wherein (a) communication or navigation utilizes RF or optical pulses, (b) all pulses within any message exhibit approximately the same RF or optical power envelope, and (c) the envelopes of all pulses within any message are approximately independent of message content. Furthermore, it is contemplated that this control signal may communicate any known or future developed waveform or reference thereto. This control signal may also communicate an on/off mode to the RF envelope amplitude controller 60.

RF envelope amplitude controller 60 is further configured to provide an amplifier control signal to amplifier 40 that is at least in part based on the system controller signal and that reduces the difference between the conversion component output signal and the reference waveform. Stated another way, RF envelope amplitude controller 60 is configured to communicate an amplifier control signal that reduces the difference between the amplifier RF output signal and a desired (industry standard) waveform/envelope.

RF envelope amplitude controller 60 also is configured to receive a feedback signal from amplifier 40, wherein the feedback signal is based on the RF output signal. For example, the feedback signal may be a representation of the actual waveform, or any suitable signal that can be interpreted to facilitate making adjustments to the amplifier control signal to cause the RF output signal to more closely exhibit the desired output waveform.

In accordance with an aspect of an exemplary embodiment of the invention, RF envelope amplitude controller 60 is configured to adjust the amplifier control signal that it provides to amplifier 40 based on dual feedback loops. This adjustment is based on a first feedback signal from the amplifier (loop 1), and is further based on a second feedback signal (loop 2) based on a comparison of a reference waveform signal to the first feedback signal.

In this exemplary embodiment, the first feedback loop adjusts the amplifier control signal in order to reduce and/or minimize the short term (i.e., over the duration of individual pulses) error between the reference waveform and the first feedback signal. The second feedback signal adjusts the amplifier control signal in order to reduce the long-term (i.e., based on many pulses) or averaged error between the reference waveform and the first feedback signal.

Due to the close similarity of adjacent pulses for the applicable formats (e.g., TACAN, TDMA, FSK, GMSK, MSK, PSK), the second loop therefore also reduces the error between any individual amplifier output pulse and the desired waveform. In general, the second loop is configured to provide a predictive and approximate waveform feedback signal for the purpose of achieving an approximation of the appropriate correction to the amplifier control signal. Although this predictive waveform is adjusted from time to time to account for changes in transmission mode, changes in temperature, or the like, it should be recognized that the second loop is not configured to be highly accurate. Rather, at least one purpose of the second loop is to reduce the amount of correction required to be supplied by the first control loop.

Thus, the gain requirement for the first loop is reduced. For a given gain-bandwidth product requirement imposed upon the first loop, a reduction in the required first loop gain may result directly in a greater available bandwidth within the first loop. Phase shifts within the first loop are thereby minimized, resulting in a relative improvement in loop stability and response time.

In addition, transmitter system 10 may be installed in higher level assemblies such as RF or optical messaging transmitters or repeaters, for example. In some embodiments, the higher level assemblies may comprise an antenna 41 configured to transmit signals to a remote location. The output of amplifier 40 may be communicated directly to antenna 41, or may first be processed by other (typically linear) components before being communicated to antenna 41.

In accordance with one exemplary embodiment, amplifier 40 is described in further detail with reference to FIG. 3, in which the transmitter system comprises an amplifier 400. In accordance with one exemplary embodiment of the present invention, amplifier 400 comprises RF input 403, and RF output 440, amplifier control signal input 404, and feedback output 503. Amplifier 400 may further comprise RF amplifiers 425 and 430, double balanced, diode ring mixers 415 and 420, diodes 405 and 410, resistances 407 and 412, and RF output feedback device 435.

In this exemplary embodiment, diode ring mixers 415 and 420 are configured to function as high speed current controlled RF attenuators. Series resistances 407 and 412 are configured to cause the control currents passing through diodes 405 and 410 to be approximately equal when driven over the normal range (e.g., zero to +2 V) of the amplifier control voltage signal provided at amplifier control signal input 404. Diodes 405 and 410 are configured to prevent the flow of current of incorrect polarity. Buffer preamplifier 425 is configured to provide an acceptable system interface impedance match at RF input port 403 despite variations in the terminal impedance of mixer 415 as a function of control current. Mixers 415 and 420, and amplifiers 425 and 430 are, for example, configured to provide a gain that is high enough to produce the maximum available power from amplifier 430 when the control signal 404 is at its maximum design value. The maximum design value of the control current is that current higher than which no substantial decrease in the attenuation of both 415 and 430 is obtained.

Feedback device 435, in one exemplary embodiment of the present invention, is configured to provide a sample of the RF output signal of amplifier 400 that facilitates adjusting the amplifier control signal at input 404 to achieve a desired adjustment to the RF output signal at RF output 440. In accordance with one aspect of an exemplary embodiment of the present invention, feedback device 435 is configured to provide a signal that reflects the RF power level of the RF output signal. For example, feedback device 435 may be a passive RF directional coupler. In another exemplary embodiment, feedback device 435 is a non-directional coupler.

Moreover, feedback device 435 may be part of amplifier 400 or may be a separate component used in conjunction with amplifier 400. Thus, feedback device 435 may be any device (s) configured to provide a signal based on and/or indicative of the RF power output of amplifier 400.

Figure 3:
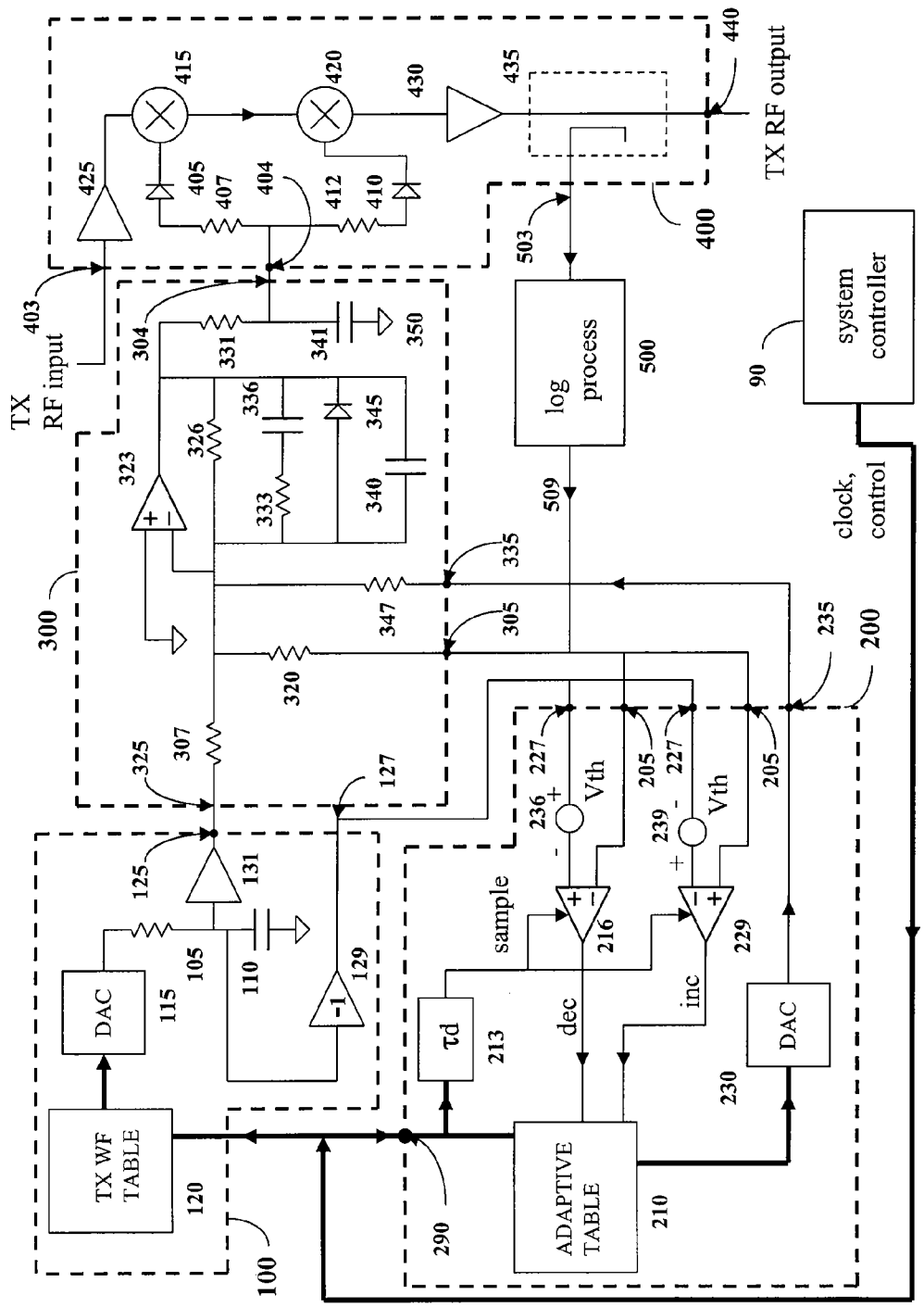
FIG. 3 is a block diagram of yet another exemplary transmitter system.
Figure 4:
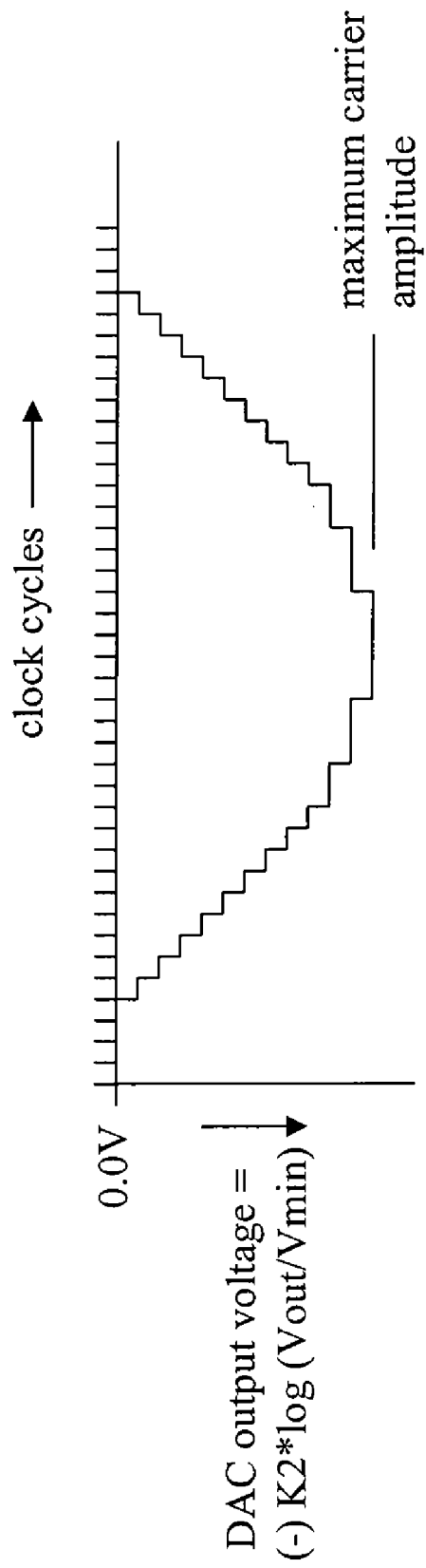
FIG. 4 illustrates the DAC output voltage at clock cycles in an exemplary transmitter device.

It will be apparent that various different components, and amplifier designs may be used to create an amplifier, and the amplifier described with reference to FIG. 3 is only one exemplary amplifier. Thus, in accordance with various exemplary embodiments, amplifier 40/400 may be any amplifier that is configured to (a) provide an amplitude modulation, or envelope power control function, (b) provide power gain where applicable, and/or (c) provide a feedback signal, i.e., a sample of the amplitude modulated (or power controlled) amplifier output power.

Figure 2:
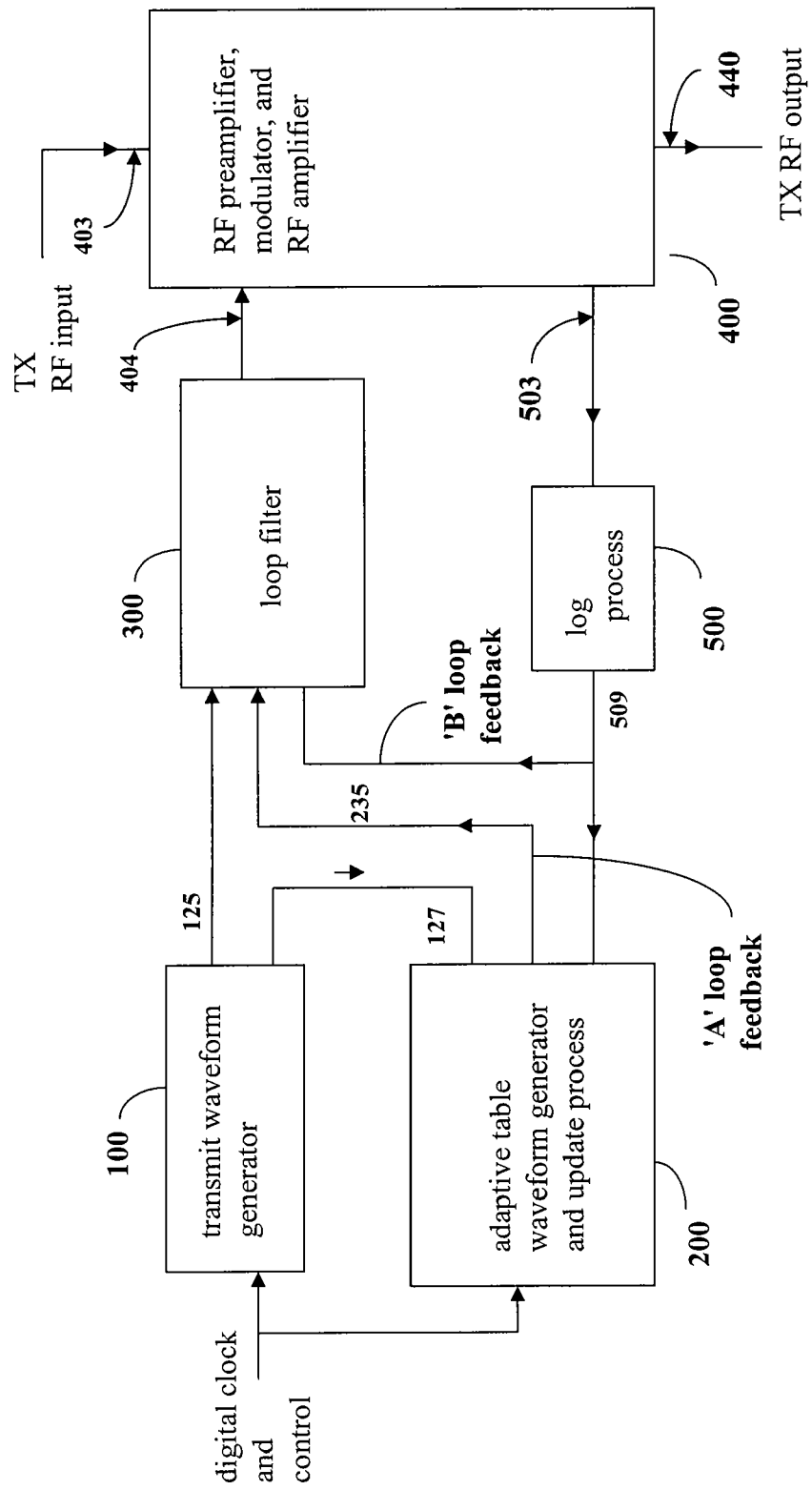
FIG. 2 is a block diagram of another exemplary transmitter system.

With reference now to FIGS. 1 & 2, in accordance with various aspects of an exemplary embodiment of the present invention, RF envelope amplitude controller 60 may comprise a transmit waveform generator 100, loop filter 300, and adaptive table waveform generator and update device ("ATWG") 200. Furthermore, RF envelope amplitude controller 60 may comprise a conversion component 500.

Figure 5:
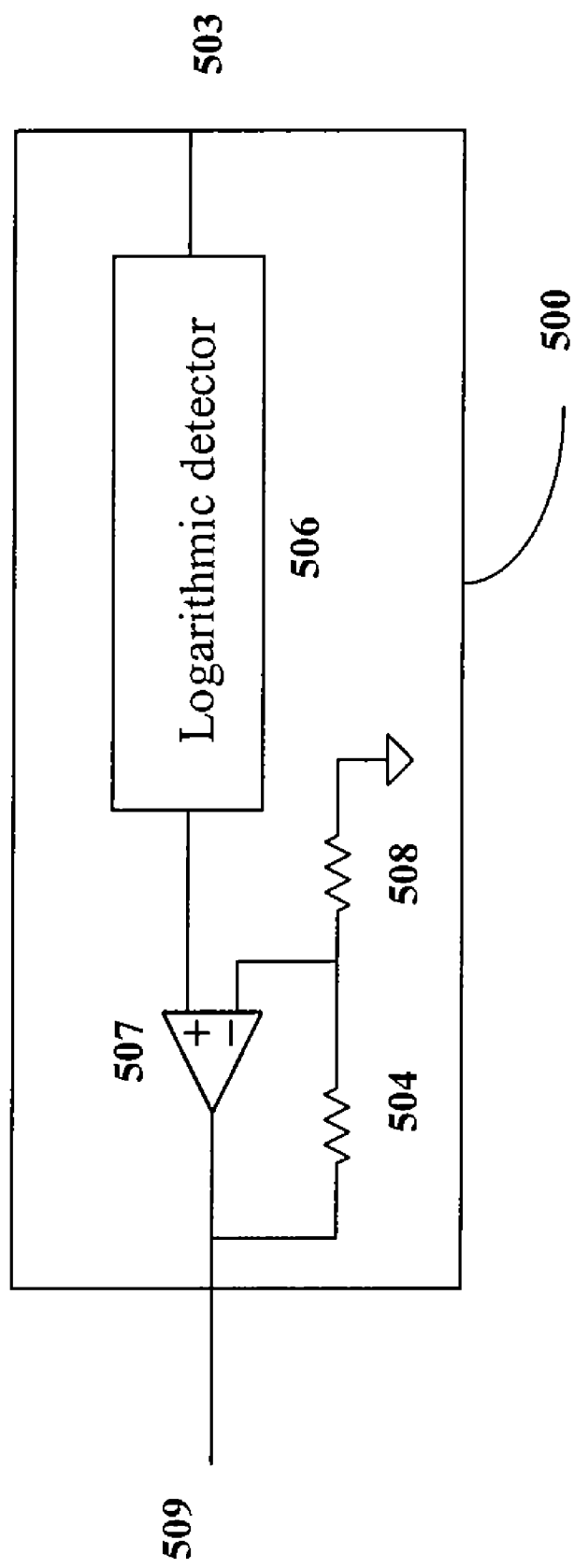
FIG. 5 is a block diagram of an exemplary conversion component in an exemplary embodiment of the present invention.

In accordance with various aspects of an exemplary embodiment of the present invention, and with reference now to FIGS. 2, 3, and 5, conversion component 500 is configured to receive a signal from amplifier (40, 400), for example from feedback device 435 and convert it to a form of feedback that is useful in determining a correction to the envelope control signal. In an exemplary embodiment, conversion component 500 may transform and/or scale the signal from input 503, and output a signal, at output 509, that represents the envelope of the sampled RF output. The input signal of conversion component 500 may, for example, be the RF output 440 reduced by the coupling factor of feedback device 435.

In accordance with various aspects of an exemplary embodiment of the present invention, conversion component 500 is a log process and comprises an input 503, output 509, and a logarithmic voltage detector 506. In one exemplary embodiment, logarithmic voltage detector 506 is configured to realize an RF input voltage to output voltage transfer function Vout=Vo1+K1*log(Vin/Vmin1) where Vin>=Vmin and K1, Vmin1 and Vo1 are arbitrary scaling and offset terms inherent in the design of 506. In another exemplary embodiment, logarithmic voltage detector 506 is an integrated circuit of conventional design. For example, detector 506 may be an AD8314, manufactured by Analog Devices, with an RF input voltage to output voltage transfer function Vout=Vo2+K2*log (Vin/Vmin2) where Vin>=Vmin and K2, Vmin2 and Vo2 are arbitrary scaling and offset terms inherent in the design of the AD8314. Moreover, the output signal at conversion component output 509 may be a linear or nonlinear function of, for example, the peak RF voltage at RF output 440. These other transfer functions can include thermal detectors (that measure the power of the sampled RF signal through its heating effect on the sensor), square law diode detectors, and/or the like.

Conversion component 500 may further comprise a voltage buffer 507 and associated resistors 504 and 508. Buffer 507 is configured to provide a low impedance output at output port 509. Furthermore, other devices may be used to provide a low impedance output at output port 509. In addition, conversion component 500 may be incorporated as part of amplifier 400, as part of feedback device 435, as a separate component, etc.

In accordance with various aspects of an exemplary embodiment of the present invention, transmit waveform generator 100 is configured to receive system controller signal(s), containing information such as memory address, mode, and/or clock. The transmit waveform generator 100 is also configured to generate a transmit waveform generator output signal(s) that facilitates adjusting the RF output signal of amplifier 400 to within a close approximation of a desired RF amplifier output envelope.

In one exemplary embodiment, the conversion component 500 is a logarithmic voltage converter, and the transmit waveform generator output signal is the logarithm of the desired RF output voltage. The transmit waveform generator output signal from transmit waveform generator output port 125 is summed with the feedback waveform signal from conversion component output 509. This sum is an error signal that is one of two error signals that are the basis for the amplifier control signal received at amplifier control input 404. Transmit waveform generator 100 may be configured to provide this transmit waveform generator output signal to loop filter 300 and to adaptive table waveform generator 200. In one exemplary embodiment, the signal to adaptive table waveform generator 200 is inverted.

In accordance with various aspects of an exemplary embodiment of the present invention, transmit waveform generator 100 comprises digital memory 120, digital to analog converter ("DAC") 115, and amplifiers 129 and 131.

In accordance with one exemplary embodiment of the present invention, transmit waveform generator 100 is configured to receive address, mode, and/or clock digital inputs. These inputs may, for example, be received from a system controller 90. In an exemplary embodiment, transmit waveform generator 100 is further configured to look up, in memory 120, a digital word corresponding to the address in the control signal and provide the digital word to DAC 115. Transmit waveform generator 100 is further configured to provide the output of DAC 115, across resistor 105, to operational amplifier 131, which is configured to provide a low impedance at transmit waveform generator output 125. Transmit waveform generator 100 may further comprise op amp 129 that is configured to invert the output of DAC 115 and provide that output signal, at transmit waveform generator output port 127, to ATWG 200.

Moreover, transmit waveform generator 100 may comprise any suitable device that is configured to receive system controller signals and generate a transmit waveform generator output signal(s) that facilitates adjusting the RF output signal of amplifier 400 to within a close approximation of a desired RF amplifier output envelope.

In accordance with various aspects of an exemplary embodiment of the present invention, adaptive table waveform generator and update device ("ATWG") 200 is configured to provide macro level adjustments to the amplifier control signal. In this regard, ATWG 200 may be configured to compare the signal from transmit waveform generator 100 to the feedback signal and to create a second feedback signal that may be used to further adjust the amplifier control signal. In various embodiments, ATWG 200 only adjusts the amplifier control signal when the difference between the transmit waveform generator signal and the feedback signal exceeds a threshold.

In accordance with various aspects of an exemplary embodiment of the present invention, ATWG 200 is configured to adjust the amplifier control signal using an adaptive table that stores the last value. For example, ATWG 200 may be configured to adjust an adaptive table when the difference between the transmit waveform generator signal and the feedback signal is large enough. The adjustment may consist of incrementing or decrementing the value stored in the adaptive table. In one exemplary embodiment, ATWG 200 is configured to read the value stored in the adaptive table and to generate a signal based on the value stored in the adaptive table. That signal may be provided by AWTG 200 to loop filter 300 to adjust the amplifier control signal (when it is appropriate that the amplifier control signal be adjusted).

With continued reference to FIG. 3, in accordance with various aspects of an exemplary embodiment of the present invention, ATWG 200 comprises system controller (i.e., clock/control) input 290, transmit waveform generator input(s) 227, feedback input(s) 205, and ATWG output 235. In accordance with various aspects of an exemplary embodiment of the present invention, ATWG 200 further comprises adaptive table 210, DAC 230, comparators 216 and 229, offset voltages, Vth, 236 and 239, and operational clock timing delay 213. In one exemplary embodiment, adaptive table 210 consists of high speed random access memory that is configured to be sequentially addressed by the system clock in synchronization with reference waveform memory 120, so that address N of 210 corresponds to address N of 120.

In one exemplary embodiment, the conversion component output signal at output 509 (input 205) and the reference waveform output signal at transmit waveform generator output 127 are connected to the inputs of high-speed voltage comparators 216 and 229 through offset voltages 236 and 239. In one exemplary embodiment, comparators 216 and 229 are LT1016 comparators, manufactured by Linear Technology, Inc., and are capable of nanosecond response times. An optional clock timing delay 213 is configured to define the comparator sampling time in relation to the clock edge. In one exemplary embodiment, ATWG 200 is configured so that the comparator outputs can update or modify the data contents at any one adaptive table address N once during the duration of a transmit pulse, based upon the outputs of comparators 216 and 229 at sample N. In another exemplary embodiment, ATWG 200 is configured so that the comparator outputs can update or modify the data contents at any one adaptive table address (N-1) once during the duration of a transmit pulse, based upon the outputs of comparators 216 and 229 at sample N. Furthermore, ATWG 200 may be configured to modify the data contents of the adaptive table, based on the comparator outputs, in any other suitable way.

By way of example, if the voltage of the feedback signal from log processor output 509 exactly matched the reference waveform voltage from output 127, no system correction would be made. In this case, the offset voltage devices 236 and 239 are configured to maintain the outputs of comparators 216 and 229 respectively at 'low' levels (most negative) despite small offsets and noise at the comparator inputs, and no changes would be made to the data in the adaptive table.

Continuing this example, if the detected log output voltage at output 509 (input 205) is less positive than the reference waveform voltage at inputs 227 by more than the voltage of offset voltage 236, then comparator 216 goes 'high' (most positive). This 'high' state of comparator 216 decrements (makes less positive) the value of the adaptive table data at the current address.

Similarly, if the detected log output voltage at output 509 (input 205) is more positive than the reference waveform voltage at input 227 by more than the voltage of offset voltage 239, then comparator 229 goes 'high.' This 'high' state of comparator 229 increments (makes more positive) the value of the adaptive table data at the current address.

The value of the integer by which the adaptive table is incremented or decremented is not critical. However, excessively large values would constitute a large fraction of the maximum data word size in the adaptive table, thereby reducing the accuracy of the 'A' loop correction process.

Figure 6:
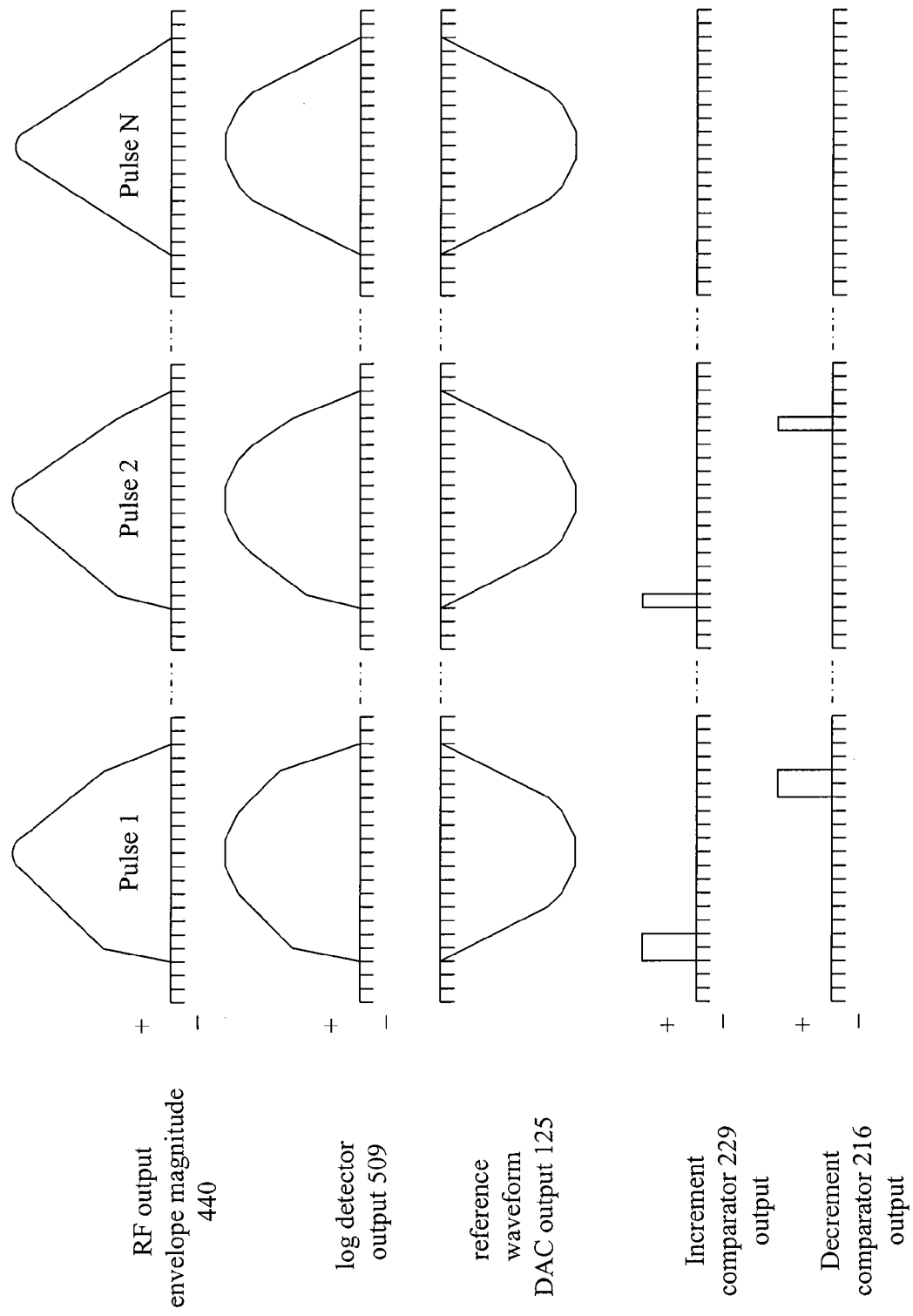
FIGS. 6 & 7 illustrate exemplary timing diagrams.
Figure 7:
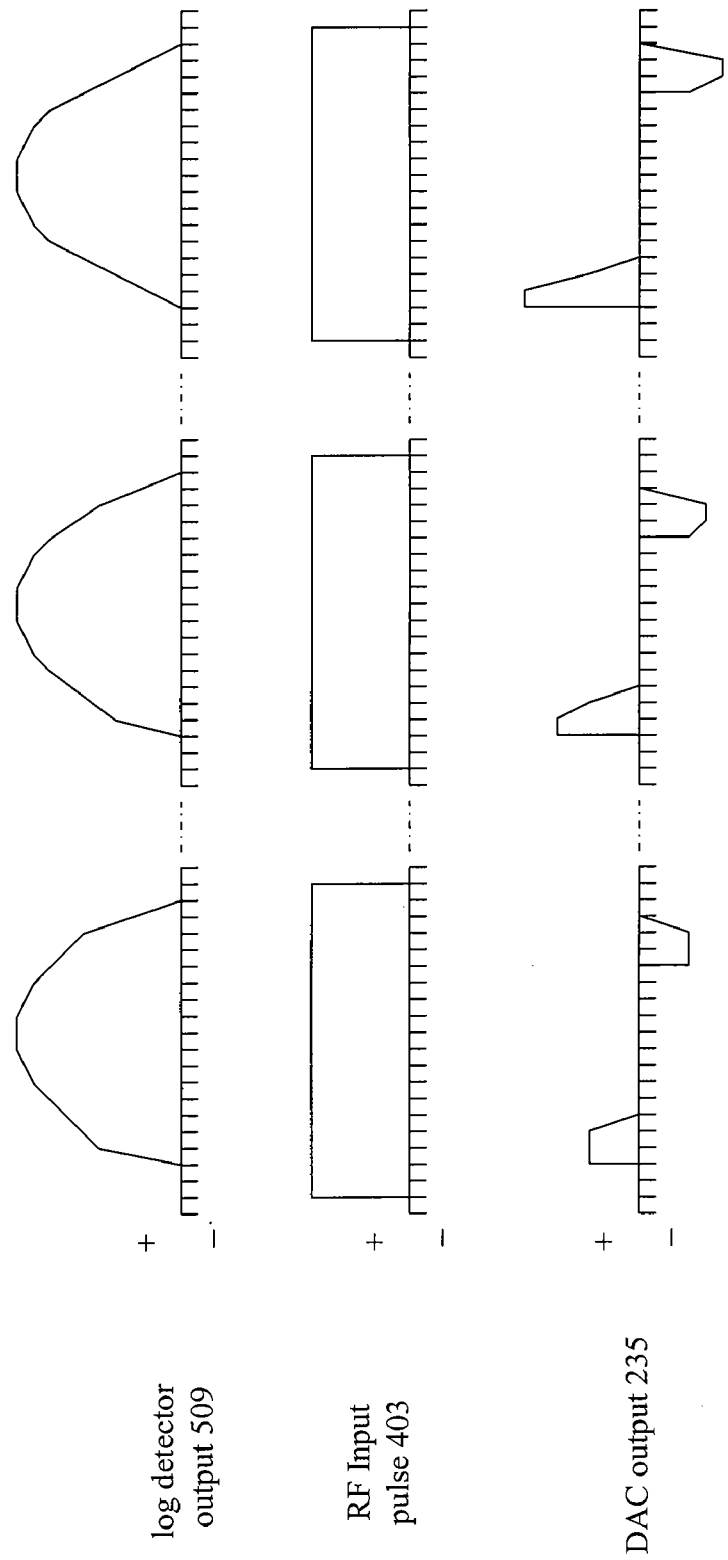

In one exemplary embodiment, the sense or polarity of DAC 230 is configured so that the most positive data value corresponds to maximum positive output at ATWG output port 235. Furthermore, the transmitter system may be configured such that ATWG output port 235 is in electrical communication with the inverting input of loop filter 300, thereby creating a negative feedback loop comprising blocks 200, 300, 400, and 500. The offset voltage devices 236 and 239 are further configured to limit the corrective action of the 'A' adaptive table loop to those regions of the waveform exhibiting comparatively large errors. As illustrated in FIGS. 6 & 7, the contents of the adaptive table continue to change as long as the threshold of either comparator is exceeded, and remain uncharged thereafter unless changes in operating conditions such as temperature, output power selection, or waveform selection occur.

Although one exemplary embodiment is described here, the transmitter system may also comprise other systems that comprise a first feedback loop for correcting an RF amplifier output signal envelope to a reference envelope, and a second feedback loop, wherein the second feedback loop provides additional correction when the error between a reference envelope and the actual envelope is large.

In accordance with various aspects of an exemplary embodiment of the present invention loop filter 300 is configured to combine signals representing a reference waveform signal, a first feedback signal, and a second feedback signal and to generate an amplifier control signal that facilitates adjusting the output signal from the RF amplifier to meet the accuracy requirements of the desired reference waveforms.

In one exemplary embodiment of the present invention, loop filter 300 comprises initial amplifier control signal input 325, first feedback input 305, second feedback input 335, and output 304. In this exemplary embodiment, loop filter 300 also comprises an operational amplifier 323, resistors 307, 320, 347, 326, 333, and 331, capacitors 336, 340 and 341, diode 345, and ground 350. Operational amplifier 323, in this embodiment, is connected as an inverting summer, driven by voltage sources from inputs 305, 335, and 325. When all functional blocks are interconnected as in FIG. 3, loop filter 300, with the exception of diode 345, comprises a conventional error amplifier (i.e., a 'loop filter') having a suitable phase lead and lag compensation configured to provide closed loop stability. Diode 345 is configured to limit the output voltage of operational amplifier 323 to small negative values during transient conditions.

Nevertheless, other devices may be used to generate an amplifier control signal based a reference waveform signal, an analog feedback signal, and a predictive approximation feedback signal, wherein the amplifier control signal is used to adjust the output signal from the RF amplifier to meet the accuracy requirements of the desired reference waveforms.

Furthermore, other components and assemblies may be used, and RF envelope amplitude controller 60 may comprise any device(s) that are configured to exhibit transfer functions equivalent to that described above, as measured individually between the inputs 325, 290, 227, or 503 and the output 304.

In accordance with various aspects of an exemplary embodiment of the present invention, the amplified RF output signal is provided to an antenna. Furthermore, the RF output signal may pass through other linear devices prior to reaching the antenna.

Figure 8:
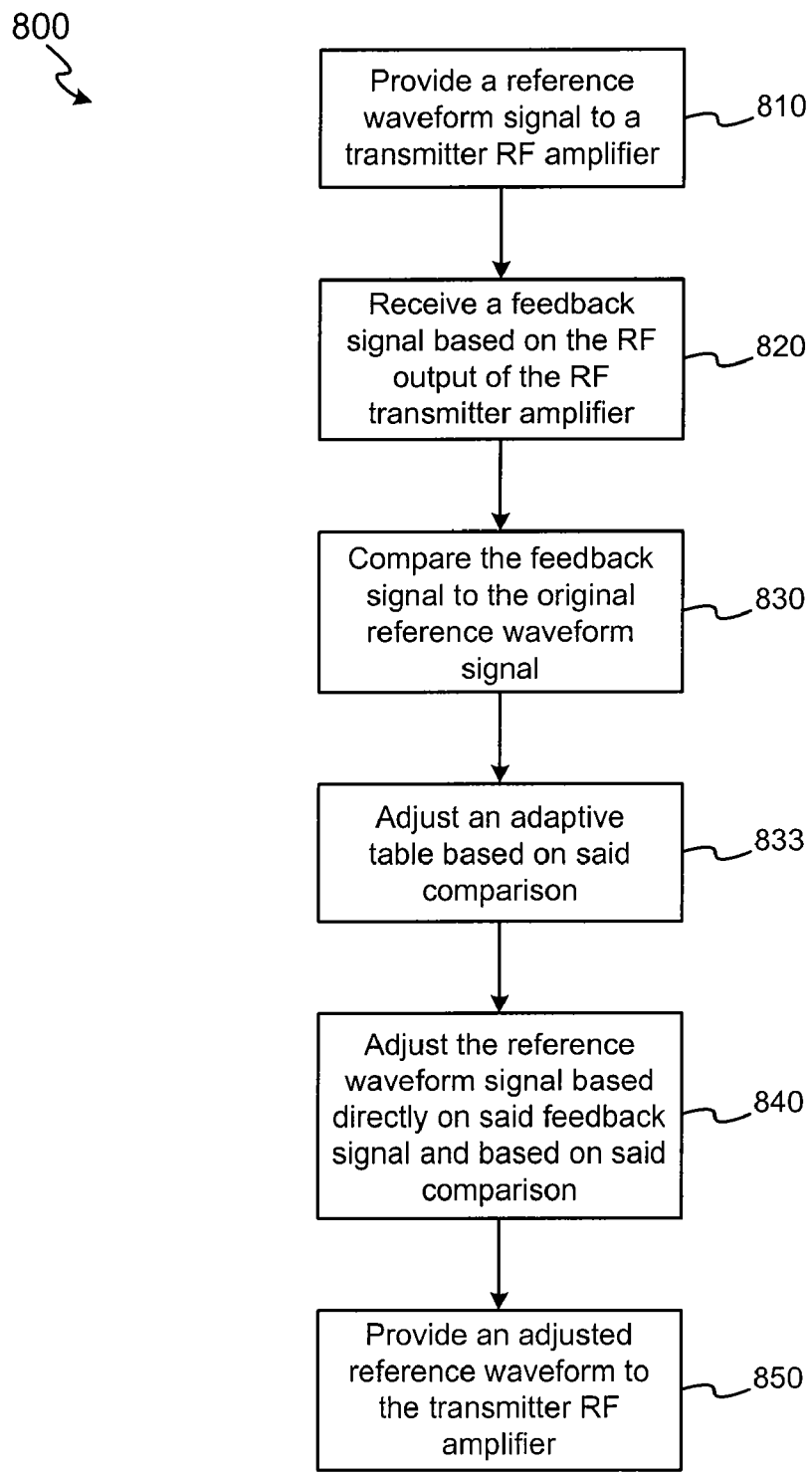
FIG. 8 is a flow diagram showing an exemplary method of controlling RF envelope amplitude.

In one exemplary embodiment of the present invention, and with reference to FIG. 8, an exemplary RF envelope amplitude control method 800 comprises the steps of: providing a reference waveform signal to a transmitter RF amplifier (step 810), receiving a feedback signal based on the RF output of the RF transmit amplifier (step 820), comparing the feedback signal to the original reference waveform signal (step 830), adjusting an adaptive table (step 833), providing an adjustment to the reference waveform signal based directly on the feedback signal and based on the comparison (step 840), and/or providing an adjusted reference waveform to the transmitter RF amplifier (step 850).

Providing an adjustment to the reference waveform signal (step 840) may further comprise the steps of combining the reference waveform signal with the feedback signal and with a second feedback signal, which second feedback signal represents the difference between said reference waveform signal and said feedback signal. The second feedback signal adjusts the reference waveform signal such that the result is a close approximation of the amplifier control signal that will cause the amplifier to generate an RF output within a close approximation of a specified waveform envelope. In contrast, the first feedback signal makes fine adjustments to the amplifier control signal to further reduce or minimize the RF output signal's deviation from the specified waveform envelope.

The invention may be described herein in terms of functional block components, optional selections and/or various processing steps. It should be appreciated that such functional blocks may be realized by any number of hardware and/or software components suitably configured to perform the specified functions. For example, the invention may employ various integrated circuit components, e.g., memory elements, processing elements, logic elements, look-up tables, and/or the like, which may carry out a variety of functions under the control of one or more microprocessors or other control devices. Similarly, the software elements of the invention may be implemented with any programming or scripting language such as C, C++, Java, COBOL, assembler, PERL, Visual Basic, SQL Stored Procedures, extensible markup language (XML), with the various algorithms being implemented with any combination of data structures, objects, processes, routines or other programming elements. Further, it should be noted that the invention may employ any number of conventional techniques for data transmission, messaging, data processing, network control, and/or the like.

It should be appreciated that the particular implementations shown and described herein are illustrative of the invention and its best mode and are not intended to otherwise limit the scope of the invention in any way. Indeed, for the sake of brevity, conventional amplifiers and electronic components, application development and other functional aspects of the systems (and components of the individual operating components of the systems) may not be described in detail herein. It should be noted that many alternative or additional functional relationships or physical connections might be present in a practical RF envelope amplitude control system.

As may be appreciated by one of ordinary skill in the art, the invention may take the form of an entirely software embodiment, an entirely hardware embodiment, or an embodiment combining aspects of both software and hardware or other physical devices. Furthermore, the invention may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

These computer program instructions may also be stored in a computer-readable memory that may direct a computer or other programmable data processing apparatus to function in a particular manner. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus include steps for implementing the functions specified in the flowchart block or blocks.

In the foregoing specification, the invention has been described with reference to specific embodiments. However, it may be appreciated that various modifications and changes may be made without departing from the scope of the invention. The specification and figures are to be regarded in an illustrative manner, rather than a restrictive one, and all such modifications are intended to be included within the scope of invention. Accordingly, the scope of the invention should be determined by the appended claims and their legal equivalents, rather than by the examples given above. For example, the steps recited in any of the method or process claims may be executed in any order and are not limited to the order presented.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical".

I claim:

1. An RF envelope amplitude control system, the system comprising:
   an RF amplifier configured to receive an RF input signal and to output an RF output signal, wherein said RF amplifier is associated with a feedback device that is configured to create a first feedback signal representing the power in said RF output signal;
   a transmit waveform generator configured to generate a reference waveform signal;
   an adaptive table waveform generator configured to compare said reference waveform signal and said first feedback signal and to create a second feedback signal based on the distortion between said reference waveform signal and said first feedback signal; and
   a loop filter configured to combine said reference waveform signal, said first feedback signal, and said second feedback signal to form an amplifier control signal, wherein said amplifier control signal is provided to said RF amplifier to adjust said RF output signal to reduce nonlinearity in said RF output signal with reference to a specified RF envelope.

2. The RF envelope amplitude control system of claim 1, further comprising a conversion component configured to convert said first feedback signal to a voltage signal that is representative of the RF envelope but is not necessarily a linear function of the first feedback signal.

3. The RF envelope amplitude control system of claim 2, wherein said conversion component further comprises a logarithmic detector, and wherein said feedback device is a passive RF directional coupler.

4. The RF envelope amplitude control system of claim 1, wherein said amplifier control signal is provided to said RF amplifier to minimize the distortion between said RF output signal and a specified RF envelope.

5. The RF envelope amplitude control system of claim 1, further comprising a memory, wherein said transmit waveform generator is configured to receive a predefined RF envelope waveform, and to output said predefined RF envelope waveform as said reference waveform signal.

6. The RF envelope amplitude control system of claim 1, wherein said adaptive table stores a value for the waveform in a table and wherein said value is adjusted based on said comparison between said first feedback signal and said reference waveform.

7. The RF envelope amplitude control system of claim 1, wherein said specified RF envelope is any envelope associated with any waveform for communication or navigation that utilizes RF or optical pulses.

8. The RF envelope amplitude control system of claim 1, wherein said specified RF envelope is that associated with one of the following transmission modes: TACAN, TDMA, FSK, GMSK, MSK, and PSK.

9. An RF envelope amplitude control system, the system comprising:
   an RF amplifier configured to receive an RF input signal and to output an RF output signal, wherein said RF amplifier is associated with a feedback device that is configured to create a first feedback signal representing the power in said RF output signal;
   a transmit waveform generator configured to generate a reference waveform signal;
   an adaptive table waveform generator configured to compare said reference waveform signal and said first feedback signal and to create a second feedback signal based on the difference between said reference waveform signal and said first feedback signal; and
   a loop filter configured to form an amplifier control signal, wherein said amplifier control signal is based on said reference waveform signal, said first feedback signal, and said second feedback signal, wherein said second feedback signal facilitates a predictive and approximate correction to said amplifier control signal, and wherein said first feedback signal facilitates reducing the difference between said RF output signal and a specified RF envelope, and
   wherein said amplifier control signal is provided to said RF amplifier to adjust said RF output signal to reduce the difference between said RF output signal and a specified RF envelope.

10. The RF envelope amplitude control system of claim 5, wherein said predefined RF envelope waveform is stored at an address of said memory, and said address is received at said transmit waveform generator.

11. The RF envelope amplitude control system of claim 1, wherein said second feedback signal facilitates a pre-distortion correction to said amplifier control signal, and wherein said first feedback signal facilitates reducing the nonlinearity of said RF output signal in comparison to said specified RF envelope.

12. The RF envelope amplitude control system of claim 1, wherein said amplifier control signal is provided to said RF amplifier to adjust said RF output signal to reduce the distortion between said RF output signal and said specified RF envelope.

* * * * *